United States Patent
Chou et al.

(10) Patent No.: US 9,374,538 B2
(45) Date of Patent: Jun. 21, 2016

(54) IMAGE SENSOR WITH EMBEDDED INFRARED FILTER LAYER

(71) Applicant: TAIWAN SEMICONDUCTOR MANUFACTURING CO., LTD., Hsinchu (TW)

(72) Inventors: Keng-Yu Chou, Kaohsiung (TW); Kazuaki Hashimoto, Zhubei (TW); Jen-Cheng Liu, Zhubei (TW); Jhy-Jyi Sze, Hsin-Chu (TW); Wei-Chieh Chiang, Yuanlin Township (TW); Pao-Tung Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/486,803

(22) Filed: Sep. 15, 2014

(65) Prior Publication Data

US 2016/0080669 A1    Mar. 17, 2016

(51) Int. Cl.
*H04N 5/33* (2006.01)
*H04N 5/335* (2011.01)
*G02B 1/11* (2015.01)
*H04N 9/04* (2006.01)

(52) U.S. Cl.
CPC ............... *H04N 5/335* (2013.01); *G02B 1/11* (2013.01); *H04N 5/33* (2013.01); *H04N 9/045* (2013.01); *H04N 2209/042* (2013.01)

(58) Field of Classification Search
CPC ............... H04N 5/335; H04N 5/2252; H04N 2201/02483; H04N 5/33; H04N 9/045; H04N 2209/042; H04N 1/00519; H04N 5/217; G02B 1/11
USPC ............ 348/208.11, 268, 270, 271, 277, 278, 348/279, 290, 333.08, 335, 342
See application file for complete search history.

(56) References Cited

U.S. PATENT DOCUMENTS

| | | | |
|---|---|---|---|
| 9,161,449 B2* | 10/2015 | Jan | ............ H05K 1/18 |
| 2011/0260059 A1* | 10/2011 | Jiang | ............ H01L 27/1461 250/330 |
| 2011/0310472 A1* | 12/2011 | Hirai | ............ C23C 14/081 359/359 |
| 2012/0243077 A1* | 9/2012 | Osawa | ............ G02B 3/0056 359/356 |
| 2013/0258455 A1* | 10/2013 | Pei | ............ G02B 5/208 359/355 |
| 2014/0043677 A1* | 2/2014 | Chen | ............ G02B 13/14 359/356 |
| 2015/0123226 A1* | 5/2015 | Choi | ............ H01L 27/1464 257/432 |

* cited by examiner

*Primary Examiner* — Hung Lam
(74) *Attorney, Agent, or Firm* — Maschoff Brennan

(57) ABSTRACT

An image sensor includes a substrate, photosensitive devices, a color filter layer, a micro-lens layer and an infrared filter layer. The photosensitive devices are disposed in the substrate. The color filter layer is disposed to cover the photosensitive devices. The micro-lens layer is disposed on the color filter layer. The infrared filter layer directly covers the micro-lens layer.

13 Claims, 5 Drawing Sheets

IMAGE SENSOR WITH EMBEDDED INFRARED FILTER LAYER

BACKGROUND

Image sensors are usually operated to sense light. Typically, the image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These image sensors absorb light and convert the sensed light into digital data or electrical signals.

When a trend of electronic products including image sensors, such as mobile phone cameras, is developed toward more and more compact design, camera modules of the mobile phone cameras need to be scaled down. However, as the thickness of the mobile phones keeps shrinking down, it is more difficult to produce the camera modules with a desired thickness for the compact mobile phone camera.

Accordingly, while conventional image sensors may have been generally adequate for certain purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
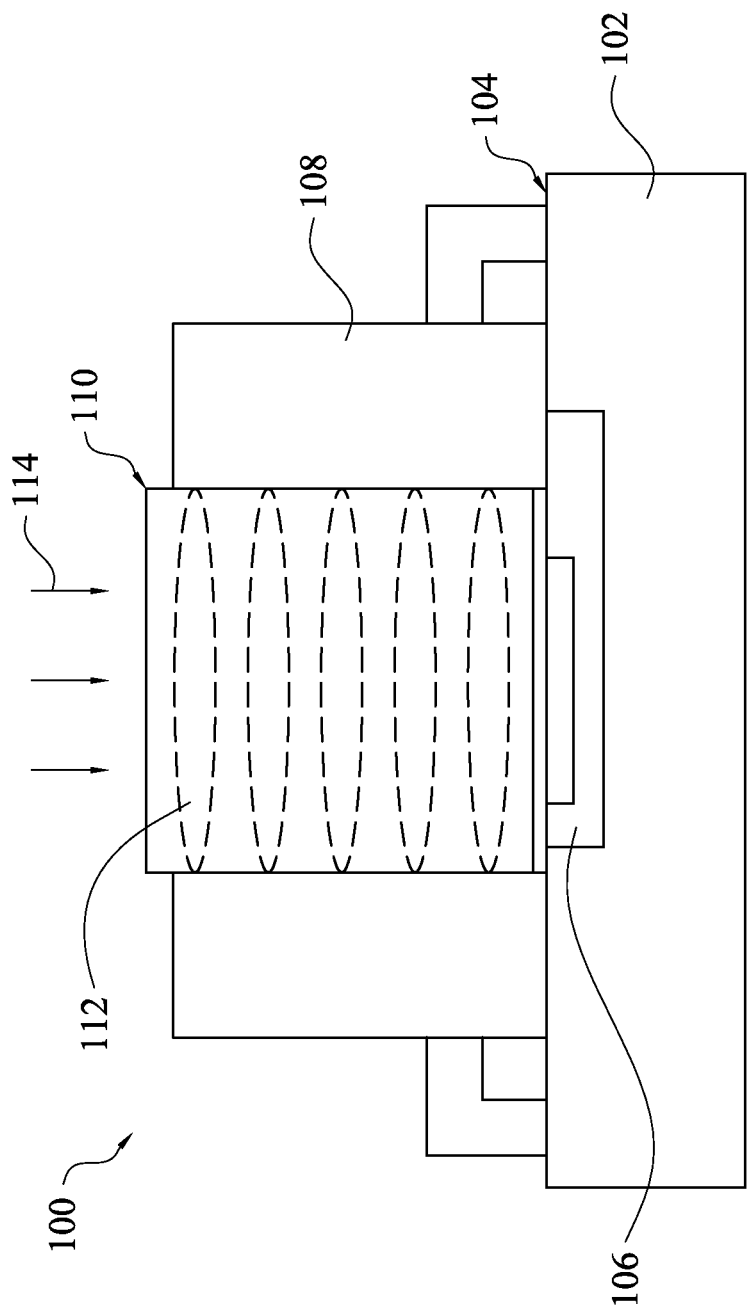
FIG. 1 is a schematic cross-sectional view of an image module in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In photography, infrared radiation needs to be screened out from incident radiation. Typically, an image module, such as a camera module, includes an image sensor and a lens module disposed over the image sensor, in which the lens module includes an infrared filter element covering the image sensor to filter out the infrared radiation from the incident radiation before the incident radiation enters the image sensor. Thus, the image sensor can only receive visible radiation and reproduce a visual-like image. However, the infrared filter element includes a glass substrate and an infrared filter layer coating on the glass substrate, and the glass substrate is too thick to thin the camera module for an advanced electronic application, such as a mobile phone camera.

Embodiments of the present disclosure are directed to providing an image sensor and a method for manufacturing the image sensor, in which the image sensor includes an embedded infrared filter layer, so that a glass substrate of an infrared filter element of a typical image module can be eliminated, and the thickness of the image module can be significantly reduced. Furthermore, because the glass substrate of the infrared filter element is eliminated, the amount of radiation entering the image sensor is increased. Accordingly, quantum efficiency of the image sensor is enhanced.

FIG. 1 is a schematic cross-sectional view of an image module in accordance with some embodiments. In some embodiments, an image module 100 is a camera module, which may be operated for photographing. As shown in FIG. 1, the image module 100 includes a substrate 102, an image sensor 106, a holder 108 and a lens module 110. The substrate 102 may be a circuit board, such as a printed circuit board (PCB) and a flexible printed circuit board (FPCB), so that the substrate 102 includes various circuits formed therein.

In some embodiments, the image sensor 106 is a CMOS image sensor device, which may be operated for sensing incident radiation 114. The image sensor 106 is formed in a surface 104 of the substrate 102 and is electrically connected to the substrate 102. The image sensor 106 is formed with an infrared filter layer which can filter out infrared radiation from the incident radiation 114. Thus, the image module 100 can be fabricated without an additional infrared filter element disposed over the image sensor 106.

The lens module 110 includes various lenses 112, and the lenses 112 are typically arranged in series to condense the incident radiation 114 for a desired optical effect. The lens module 110 is held in a holder 108, and the holder 108 with the lens module 110 is mounted onto the surface 104 of the substrate 102 and is directly disposed over the image sensor 106. Thus, after the incident radiation 114 is condensed by the lenses 112 of the lens module 110, the incident radiation 114 can enter the image sensor 106 and be received by the image sensor 106, infrared radiation of the incident radiation 114 is filtered out by the infrared filter layer of the image sensor 106, and the image sensor 106 can convert optical signals of the incident radiation 114 with no infrared radiation into digital data or electrical signals so as to reproduce a visual-like image.

Figure 2:
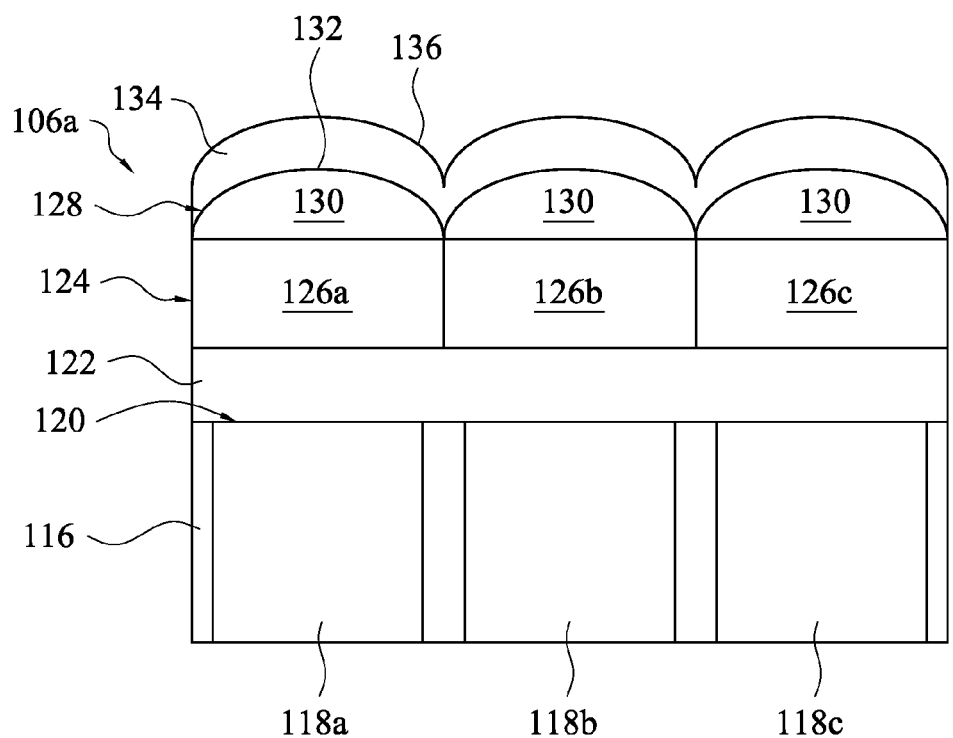
FIG. 2 is a schematic cross-sectional view of an image sensor in accordance with some embodiments.

In the image module 100, the image sensor 106 may include various types of image sensor, such as image sensors 106a, 206, 306 and 406 shown in FIG. 2 through FIG. 5. These image sensors 106a, 206, 306 and 406 are described in detail hereinafter. FIG. 2 is a schematic cross-sectional view of an image sensor in accordance with some embodiments. As shown in FIG. 2, in some embodiments, an image sensor 106a includes a substrate 116, various photosensitive devices 118a, 118b and 118c, a color filter layer 124, a micro-lens layer 128 and an infrared filter layer 134. The substrate 116 is a semiconductor substrate. The substrate 116 may be formed of a single-crystalline semiconductor material or a compound semiconductor material. For example, the substrate 116 is a silicon substrate. In some examples, carbon, germanium, gallium, arsenic, nitrogen, indium, phosphorus, and/or the like, may be included in the substrate 116.

The image sensor 106a may include various photosensitive devices 118a, various photosensitive devices 118b and various photosensitive devices 118c. The photosensitive devices 118a, 118b and 118c are formed in the substrate 116. The photosensitive devices 118a, 118b and 118c may be respectively used to sense different visible radiations, such as red light, green light and blue light. In certain examples, the photosensitive devices 118a, 118b and 118c are arranged in an array. In some examples, the photosensitive devices 118a, 118b and 118c are photodiodes. The photosensitive devices 118a, 118b and 118c can sense the radiation and convert optical signals of the radiation into electrical signals.

The color filter layer 124 is disposed over a surface 120 of the substrate 116 and covers the photosensitive devices 118a, 118b and 118c in the substrate 116. In some examples, the color filter layer 124 includes various color filter portions 126a, various color filter portions 126b and various color filter portions 126c, and locations of the color filter portions 126a, 126b and 126c respectively correspond to those of the photosensitive devices 118a, 118b and 118c. Thus, the photosensitive devices 118a, 118b and 118c can respectively receive the radiations after the radiations are filtered by the color filter portions 126a, 126b and 126c.

The micro-lens layer 128 is disposed on the color filter layer 124 and has a top surface profile 132. In some example, the micro-lens layer 128 includes various micro-lenses 130, and locations and areas of the micro-lenses 130 respectively correspond to those of the color filter portions 126a, 126b and 126c. The incident radiations are condensed by the micro-lenses 130, and then are converged on the color filter portions 126a, 126b and 126c correspondingly. The micro-lens layer 128 is composed of the micro-lenses 130, so that the top surface profile 132 is made up of top surfaces of the micro-lenses 130.

The infrared filter layer 134 is disposed on the micro-lens layer 128 to directly cover the micro-lens layer 128. The infrared filter layer 134 has a top surface profile 136. In the present embodiment, referring to FIG. 2 again, the infrared filter layer 134 is conformally disposed on the micro-lens layer 128, so that the top surface profile 136 of the infrared filter layer 134 is in a rounding shape. In some exemplary examples, the top surface profile 136 of the infrared filter layer 134 is substantially the same as a top surface profile of the micro-lens layer 128, and the micro-lens layer 128 and the infrared filter layer 134 collectively form a double-lens structure.

In some examples, the infrared filter layer 134 includes an absorptive infrared filter structure for reducing the infrared reflection. The absorptive infrared filter structure may be formed from absorptive materials, such as phosphorus pentoxide ($P_2O_5$) and cupric oxide (CuO). In certain examples, the infrared filter layer 134 includes a reflective infrared filter structure. For example, the reflective infrared filter structure may be a multi-film stacked structure, and films of the multi-film stacked structure have different refractive indexes in an infrared region for reflecting the infrared radiation. In an exemplary example, in the reflective infrared filter structure, materials of the films are selected to make any two adjacent films have a greater refractive index difference, because the greater the refractive index difference is, the higher the reflectivity of the reflective infrared filter structure is.

In addition, a refractive index of the infrared filter layer 134 may be designed based on a refractive index of an upper layer and a refractive index of a lower layer. For example, a refractive index of the micro-lens layer 128 is equal to a square root of a product of the refractive index of the infrared filter layer 134 and a refractive index of the color filter layer 124.

In various examples, as shown in FIG. 2, the image sensor 106a optionally includes an anti-reflective coating (ARC) layer 122, in which the anti-reflective coating layer 122 is disposed between the substrate 116 and the color filter layer 124. With the anti-reflective coating layer 122, the amount of the radiation entering the photosensitive devices 118a, 118b and 118c is increased.

Simultaneously referring to FIG. 1 and FIG. 2, by integrating the infrared filter layer 134 into the image sensor 106a, an additional infrared filter element can be omitted. Thus, a glass substrate of the infrared filter element can be removed from the lens module 110 to reduce the thickness of the lens module 110, so that the image module 100 is effectively thinned. Therefore, the image module 100 can be implemented into a thin electronic device, such as a thin mobile phone.

Figure 3:
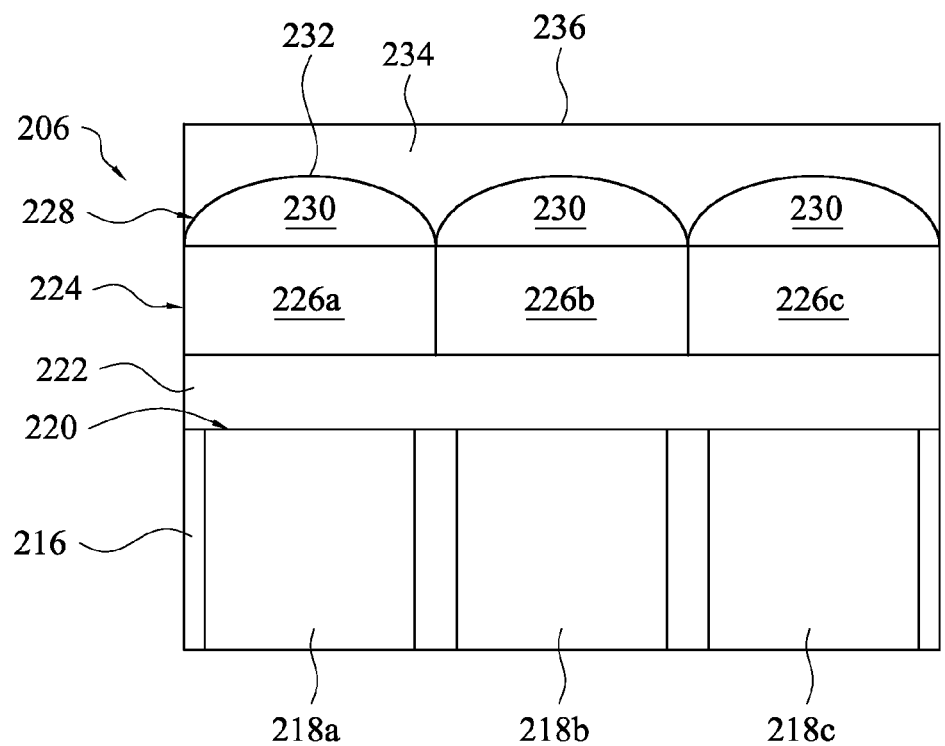
FIG. 3 is a schematic cross-sectional view of an image sensor in accordance with some embodiments.

FIG. 3 is a schematic cross-sectional view of an image sensor in accordance with some embodiments. As shown in FIG. 3, in some embodiments, an image sensor 206 includes a substrate 216, various photosensitive devices 218a, 218b and 218c, a color filter layer 224, a micro-lens layer 228 and an infrared filter layer 234. The substrate 216 is a semiconductor substrate. The substrate 216 may be formed of a single-crystalline semiconductor material or a compound semiconductor material. For example, the substrate 216 is a silicon substrate. In some examples, carbon, germanium, gallium, arsenic, nitrogen, indium, phosphorus, and/or the like, may be included in the substrate 216.

The image sensor 206 may include various photosensitive devices 218a, various photosensitive devices 218b and various photosensitive devices 218c. The photosensitive devices 218a, 218b and 218c are formed in the substrate 216. The photosensitive devices 218a, 218b and 218c may be respectively used to sense different visible radiations, such as red light, green light and blue light. The photosensitive devices 218a, 218b and 218c may be arranged in an array. In some examples, the photosensitive devices 218a, 218b and 218c are photodiodes. The photosensitive devices 218a, 218b and 218c can sense the radiation and convert optical signals of the radiation into electrical signals.

The color filter layer 224 is disposed over a surface 220 of the substrate 216 and covers the photosensitive devices 218a, 218b and 218c. In some examples, the color filter layer 224 includes various color filter portions 226a, various color filter portions 226b and various color filter portions 226c, and locations of the color filter portions 226a, 226b and 226c respectively correspond to those of the photosensitive devices 218a, 218b and 218c.

The micro-lens layer 228 is disposed on the color filter layer 224 and has a top surface profile 232. In some example, the micro-lens layer 228 includes various micro-lenses 230, and locations and areas of the micro-lenses 230 respectively correspond to those of the color filter portions 226a, 226b and 226c. The incident radiations are condensed by the micro-lenses 230, and then are converged on the color filter portions 226a, 226b and 226c correspondingly. The micro-lens layer 228 is composed of the micro-lenses 230, so that the top surface profile 232 is made up of top surfaces of the micro-lenses 230, and the top surface profile 232 is in a rounding shape.

The infrared filter layer 234 is disposed on the micro-lens layer 228 to directly cover the micro-lens layer 228. In the present embodiment, referring to FIG. 3 again, the infrared filter layer 234 has a top surface profile 236, and the top surface profile 236 is flat. Accordingly, the infrared filter layer 234 can be fabricated easily. In some examples, the infrared filter layer 234 includes an absorptive infrared filter structure for reducing the infrared reflection. The absorptive infrared filter structure may be formed from absorptive materials, such as phosphorus pentoxide and cupric oxide. In certain examples, the infrared filter layer 234 includes a reflective infrared filter structure. For example, the reflective infrared filter structure may be a multi-film stacked structure, and films of the multi-film stacked structure have different refractive indexes in an infrared region for reflecting the infrared radiation. In an exemplary example, in the reflective infrared filter structure, materials of the films are selected to make any two adjacent films have a greater refractive index difference, because the greater the refractive index difference is, the higher the reflectivity of the reflective infrared filter structure is.

In addition, a refractive index of the infrared filter layer 234 may be designed based on a refractive index of an upper layer and a refractive index of a lower layer. For example, a refractive index of the micro-lens layer 228 is equal to a square root of a product of the refractive index of the infrared filter layer 234 and a refractive index of the color filter layer 224.

In various examples, as shown in FIG. 3, the image sensor 206 optionally includes an anti-reflective coating layer 222, in which the anti-reflective coating layer 222 is disposed between the substrate 216 and the color filter layer 224. With the anti-reflective coating layer 222, the amount of the radiation entering the photosensitive devices 218a, 218b and 218c is increased.

Simultaneously referring to FIG. 1 and FIG. 3, by integrating the infrared filter layer 234 into the image sensor 206, an additional infrared filter element can be omitted. Thus, a glass substrate of the infrared filter element can be removed from the lens module 110 to reduce the thickness of the lens module 110, thereby effectively thinning the image module 100.

Figure 4:
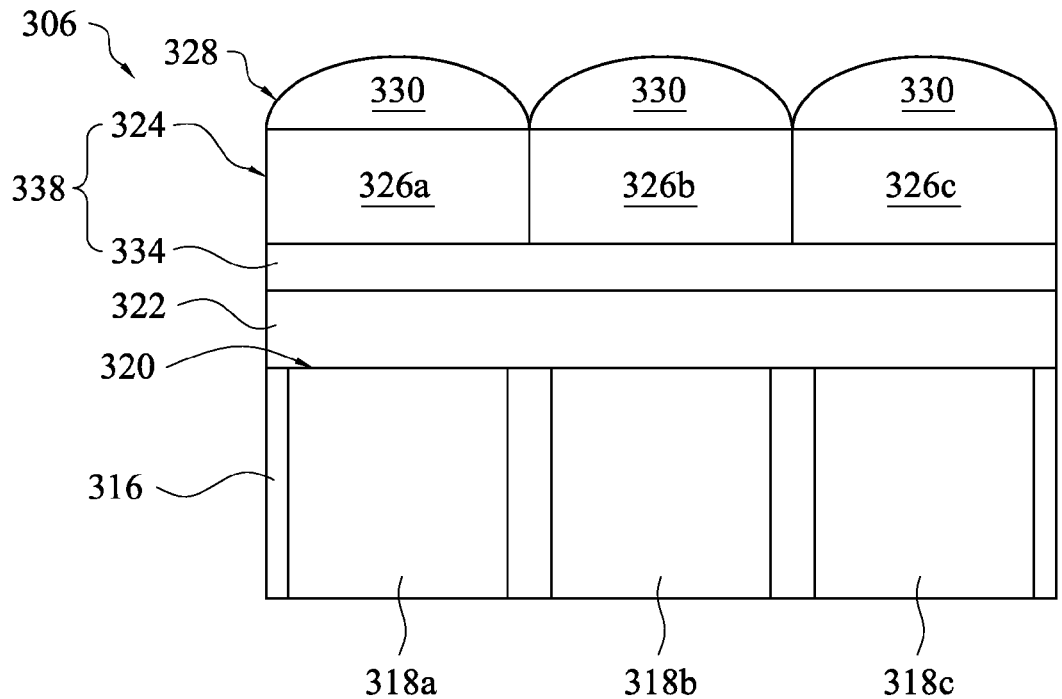
FIG. 4 is a schematic cross-sectional view of an image sensor in accordance with some embodiments.

FIG. 4 is a schematic cross-sectional view of an image sensor in accordance with some embodiments. As shown in FIG. 4, in some embodiments, an image sensor 306 includes a substrate 316, various photosensitive devices 318a, 318b and 318c, an infrared color filter structure 338 and a micro-lens layer 328. The substrate 316 is a semiconductor substrate. The substrate 316 may be formed of a single-crystalline semiconductor material or a compound semiconductor material. For example, the substrate 316 is a silicon substrate. In some examples, carbon, germanium, gallium, arsenic, nitrogen, indium, phosphorus, and/or the like, may be included in the substrate 316.

The image sensor 306 may include various photosensitive devices 318a, various photosensitive devices 318b and various photosensitive devices 318c. The photosensitive devices 318a, 318b and 318c are formed in the substrate 316. The photosensitive devices 318a, 318b and 318c may be respectively used to sense different visible radiations, such as red light, green light and blue light. The photosensitive devices 318a, 318b and 318c may be arranged in an array. In some examples, the photosensitive devices 318a, 318b and 318c are photodiodes. The photosensitive devices 318a, 318b and 318c can sense the radiation and convert optical signals of the radiation into electrical signals.

The infrared color filter structure 338 is disposed over a surface 320 of the substrate 316 and covers the photosensitive devices 318a, 318b and 318c. In some examples, as shown in FIG. 4, the infrared color filter structure 338 includes an infrared filter layer 334 and a color filter layer 324. The infrared filter layer 334 is disposed over the surface 320 of the substrate 316, and the color filter layer 324 is disposed on the infrared filter layer 334. In some examples, the infrared filter layer 334 includes an absorptive infrared filter structure for reducing the infrared reflection. The absorptive infrared filter structure may be formed from absorptive materials, such as phosphorus pentoxide and cupric oxide. In certain examples, the infrared filter layer 334 includes a reflective infrared filter structure. For example, the reflective infrared filter structure may be a multi-film stacked structure, and films of the multi-film stacked structure have different refractive indexes in an infrared region for reflecting the infrared radiation. In an exemplary example, in the reflective infrared filter structure, materials of the films are selected to make any two adjacent films have a greater refractive index difference, because the greater the refractive index difference is, the higher the reflectivity of the reflective infrared filter structure is.

In addition, a refractive index of the infrared filter layer 334 may be designed based on a refractive index of an upper layer and a refractive index of a lower layer. For example, a refractive index of the color filter layer 324 is equal to a square root of a product of the refractive index of the infrared filter layer 334 and a refractive index of the micro-lens layer 330 which is disposed on the color filter layer 324 of the infrared color filter structure 338.

In some examples, the color filter layer 324 includes various color filter portions 326a, various color filter portions 326b and various color filter portions 326c, and locations of the color filter portions 326a, 326b and 326c respectively correspond to those of the photosensitive devices 318a, 318b and 318c.

The micro-lens layer 328 is disposed on the color filter layer 324 of the infrared color filter structure 338. In some example, the micro-lens layer 328 includes various micro-lenses 330, and locations and areas of the micro-lenses 330 respectively correspond to those of the color filter portions 326a, 326b and 326c. The incident radiations are condensed by the micro-lenses 330, and then are converged on the color filter portions 326a, 326b and 326c correspondingly.

In various examples, as shown in FIG. 4, the image sensor 306 optionally includes an anti-reflective coating layer 322, in which the anti-reflective coating layer 322 is disposed between the substrate 316 and the infrared filter layer 334 of the infrared color filter structure 338. With the anti-reflective coating layer 322, the amount of the radiation entering the photosensitive devices 318a, 318b and 318c is increased.

Simultaneously referring to FIG. 1 and FIG. 4, by integrating the infrared filter layer 334 into the image sensor 306, an additional infrared filter element is not needed. Thus, a glass substrate of the infrared filter element can be removed from the lens module 110 to reduce the thickness of the lens module 110, thereby effectively thinning the image module 100.

Figure 5:
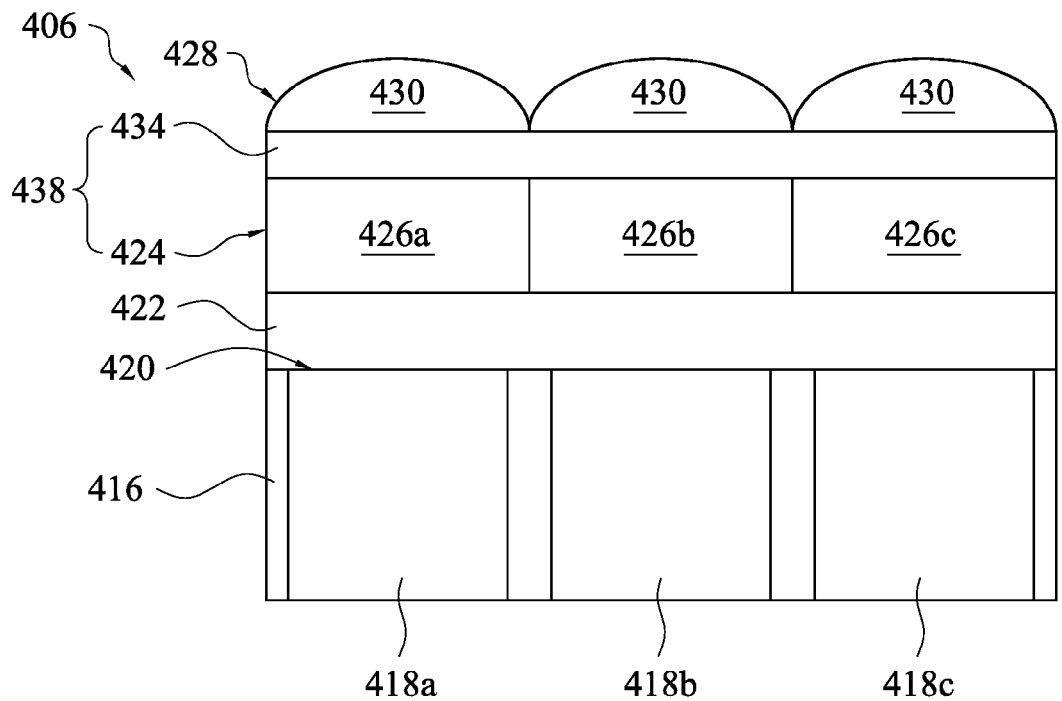
FIG. 5 is a schematic cross-sectional view of an image sensor in accordance with some embodiments.

FIG. 5 is a schematic cross-sectional view of an image sensor in accordance with some embodiments. As shown in FIG. 5, in some embodiments, an image sensor 406 includes a substrate 416, various photosensitive devices 418a, 418b and 418c, an infrared color filter structure 438 and a micro-lens layer 428. The substrate 416 is a semiconductor substrate. The substrate 416 may be formed of a single-crystalline semiconductor material or a compound semiconductor material. For example, the substrate 416 is a silicon substrate. In some examples, carbon, germanium, gallium, arsenic, nitrogen, indium, phosphorus, and/or the like, may be included in the substrate 416.

The image sensor 406 may include various photosensitive devices 418a, various photosensitive devices 418b and various photosensitive devices 418c. The photosensitive devices 418a, 418b and 418c are formed in the substrate 416. The photosensitive devices 418a, 418b and 418c may be respectively used to sense different visible radiations, such as red light, green light and blue light. The photosensitive devices 418a, 418b and 418c may be arranged in an array. In some examples, the photosensitive devices 418a, 418b and 418c are photodiodes. The photosensitive devices 418a, 418b and 418c can sense the radiation and convert optical signals of the radiation into electrical signals.

The infrared color filter structure 438 is disposed over a surface 420 of the substrate 416 and covers the photosensitive devices 418a, 418b and 418c. In some examples, as shown in FIG. 5, the infrared color filter structure 438 includes a color filter layer 424 and an infrared filter layer 434. The color filter layer 424 is disposed over the surface 420 of the substrate 416, and the infrared filter layer 434 is disposed on the color filter layer 424. In some examples, the color filter layer 424 includes various color filter portions 426a, various color filter portions 426b and various color filter portions 426c, and locations of the color filter portions 426a, 426b and 426c respectively correspond to those of the photosensitive devices 418a, 418b and 418c.

In some examples, the infrared filter layer 434 includes an absorptive infrared filter structure for reducing the infrared reflection. The absorptive infrared filter structure may be formed from absorptive materials, such as phosphorus pentoxide and cupric oxide. In certain examples, the infrared filter layer 434 includes a reflective infrared filter structure. For example, the reflective infrared filter structure may be a multi-film stacked structure, and films of the multi-film stacked structure have different refractive indexes in an infrared region for reflecting the infrared radiation. In an exemplary example, in the reflective infrared filter structure, materials of the films are selected to make any two adjacent films have a greater refractive index difference, because the greater the refractive index difference is, the higher the reflectivity of the reflective infrared filter structure is.

In addition, a refractive index of the infrared filter layer 434 may be designed based on a refractive index of an upper layer and a refractive index of a lower layer. For example, a refractive index of the infrared filter layer 434 is equal to a square root of a product of the refractive index of the color filter layer 424 and a refractive index of the micro-lens layer 430 which is disposed on the infrared filter layer 434 of the infrared color filter structure 438.

The micro-lens layer 428 is disposed on the infrared filter layer 434 of the infrared color filter structure 438. In some example, the micro-lens layer 428 includes various micro-lenses 430, and locations and areas of the micro-lenses 430 respectively correspond to those of the color filter portions 426a, 426b and 426c. The incident radiations are condensed by the micro-lenses 430 and next converged on the infrared filter layer 434, and then enter the color filter portions 426a, 426b and 426c correspondingly.

In various examples, as shown in FIG. 5, the image sensor 406 optionally includes an anti-reflective coating layer 422, in which the anti-reflective coating layer 422 is disposed between the substrate 416 and the color filter layer 424 of the infrared color filter structure 438. With the anti-reflective coating layer 422, the amount of the radiation entering the photosensitive devices 418a, 418b and 418c is increased.

Simultaneously referring to FIG. 1 and FIG. 5, by integrating the infrared filter layer 434 into the image sensor 406, no infrared filter element is needed. Thus, a glass substrate of the infrared filter element can be removed from the lens module 110 to reduce the thickness of the lens module 110, thereby effectively thinning the image module 100.

Figure 6:
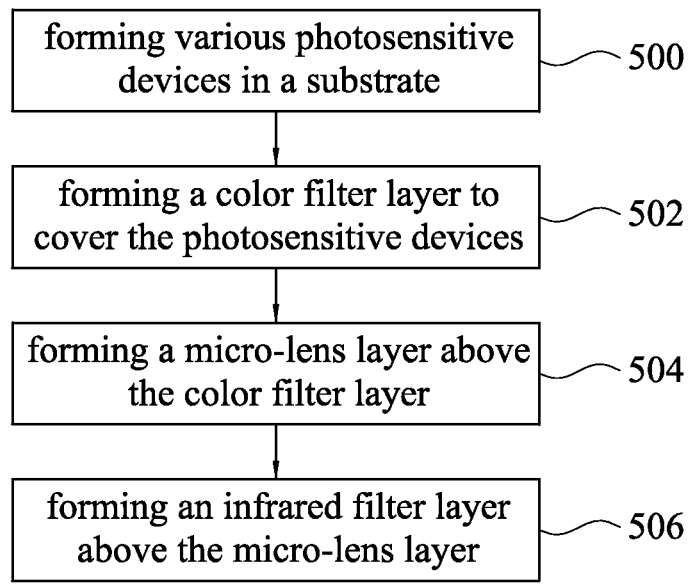
FIG. 6 is a flow chart of a method for manufacturing an image sensor in accordance with some embodiments.

Referring to FIG. 2 and FIG. 6, FIG. 6 is a flow chart of a method for manufacturing an image sensor in accordance with some embodiments. The method begins at operation 500, where various photosensitive devices 118a, 118b and 118c are formed in a substrate 116. The substrate 116 may be formed of a single-crystalline semiconductor material or a compound semiconductor material. For example, silicon, carbon, germanium, gallium, arsenic, nitrogen, indium, phosphorus, and/or the like, may be included in the substrate 116. In some examples, the photosensitive devices 118a, 118b and 118c may be respectively used to sense different visible radiations, such as red light, green light and blue light, and the photosensitive devices 118a, 118b and 118c may be arranged in an array. In certain examples, the photosensitive devices 118a, 118b and 118c are photodiodes.

At operation 502, a color filter layer 124 is formed over a surface 120 of the substrate 116 and to cover the photosensitive devices 118a, 118b and 118c using a coating process, for example. In some examples, the operation of forming the color filter layer 124 is performed to form the color filter layer 124 including various color filter portions 126a, various color filter portions 126b and various color filter portions 126c, in which locations of the color filter portions 126a, 126b and 126c respectively correspond to those of the photosensitive devices 118a, 118b and 118c.

At operation 504, a micro-lens layer 128 is formed above the color filter layer 124. In some examples, the operation of forming the micro-lens layer 128 is performed to form the micro-lens layer 128 including various micro-lenses 130, in which locations and areas of the micro-lenses 130 respectively correspond to those of the color filter portions 126a, 126b and 126c. The micro-lens layer 128 is formed to have a top surface profile 132. The micro-lens layer 128 is composed of the micro-lenses 130, so that the top surface profile 132 is made up of top surfaces of the micro-lenses 130, and the top surface profile 132 is in a rounding shape.

At operation 506, an infrared filter layer 134 is formed above the micro-lens layer 128, i.e. the infrared filter layer 134 is formed to be adjacent to the micro-lens layer 128. In certain examples, the operation of forming the infrared filter layer 134 is performed to form the infrared filter layer 134 directly covering the micro-lens layer 128. The infrared filter layer 134 is formed to have a top surface profile 136. In the present embodiments, referring to FIG. 2 again, the infrared filter layer 134 is conformally formed on the micro-lens layer 128, so that the top surface profile 136 of the infrared filter layer 134 is formed to be in a rounding shape. In some exemplary examples, the top surface profile 136 of the infrared filter layer 134 is formed to be substantially the same as a top surface profile of the micro-lens layer 128.

In the present embodiments, the top surface profile 136 of the infrared filter layer 134 is formed to be in a rounding shape. In various embodiments, as shown in FIG. 3, an top surface profile 236 of an infrared filter layer 234 is formed to be flat, so that the infrared filter layer 234 can be fabricated easily.

In some examples, the infrared filter layer 134 is formed to include an absorptive infrared filter structure for reducing the infrared reflection. The absorptive infrared filter structure may be formed from absorptive materials, such as phosphorus pentoxide and cupric oxide. In certain examples, the infrared filter layer 134 is formed to include a reflective infrared filter structure. For example, the reflective infrared filter structure may be formed to include a multi-film stacked structure, in which films of the multi-film stacked structure have different refractive indexes in an infrared region for reflecting the infrared radiation. Furthermore, in the operation of forming the infrared filter layer 134, a refractive index of the infrared filter layer 134 may be designed based on a refractive index of an upper layer and a refractive index of a lower layer. For example, a refractive index of the micro-lens layer 128 is equal to a square root of a product of the refractive index of the infrared filter layer 134 and a refractive index of the color filter layer 124.

In various examples, as shown in FIG. 2, before the operation of forming the color filter layer 124, an anti-reflective coating layer 122 is optionally formed on the surface 120 of the substrate 116 and to cover the photosensitive devices 118a, 118b and 118c. With formation of the anti-reflective coating layer 122, the amount of the radiation entering the photosensitive devices 118a, 118b and 118c is increased.

Figure 7:
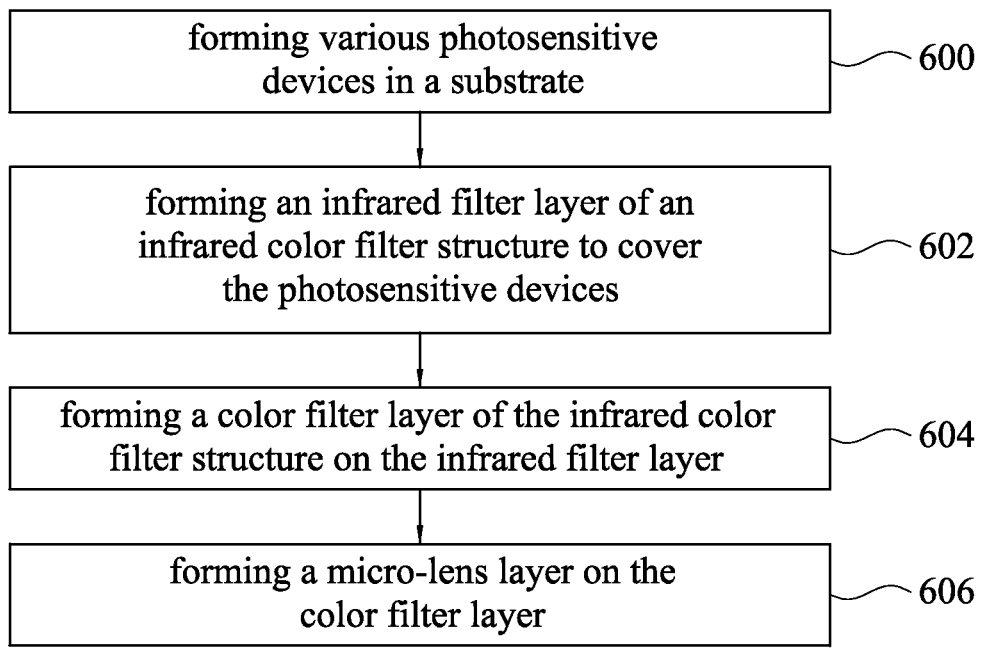
FIG. 7 is a flow chart of a method for manufacturing an image sensor in accordance with some embodiments.

Referring to FIG. 4 and FIG. 7, FIG. 7 is a flow chart of a method for manufacturing an image sensor in accordance with some embodiments. The method begins at operation 600, where various photosensitive devices 318a, 318b and 318c are formed in a substrate 316. The substrate 316 may be formed of a single-crystalline semiconductor material or a compound semiconductor material. For example, silicon, carbon, germanium, gallium, arsenic, nitrogen, indium, phosphorus, and/or the like, may be included in the substrate 316. In some examples, the photosensitive devices 318a, 318b and 318c may be respectively used to sense different visible radiations, such as red light, green light and blue light, and the photosensitive devices 318a, 318b and 318c may be arranged in an array. In certain examples, the photosensitive devices 318a, 318b and 318c are photodiodes.

Next, an infrared color filter structure 338 is formed over a surface 320 of the substrate 316. In some examples, as shown in FIG. 4, the infrared color filter structure 338 is formed to include an infrared filter layer 334 and a color filter layer 324. At operation 602, the infrared filter layer 334 of the infrared color filter structure 338 is formed to cover the photosensitive devices 318a, 318b and 318c using a coating process, for example. In some examples, the infrared filter layer 334 is formed to include an absorptive infrared filter structure for reducing the infrared reflection. The absorptive infrared filter structure may be formed from absorptive materials, such as phosphorus pentoxide and cupric oxide. In certain examples, the infrared filter layer 334 is formed to include a reflective infrared filter structure. For example, the reflective infrared filter structure may be formed to include a multi-film stacked structure, in which films of the multi-film stacked structure have different refractive indexes in an infrared region for reflecting the infrared.

At operation 604, the color filter layer 324 of the infrared color filter structure 338 is formed on the infrared filter layer 334 using, for example, a coating process, i.e. the infrared filter layer 334 is formed to be adjacent to the color filter layer 324 and under the color filter layer 324. In some examples, the operation of forming the color filter layer 324 is performed to form the color filter layer 324 including various color filter portions 326a, various color filter portions 326b and various color filter portions 326c, in which locations of the color filter portions 326a, 326b and 326c respectively correspond to those of the photosensitive devices 318a, 318b and 318c.

At operation 606, a micro-lens layer 328 is formed above the color filter layer 324. In some example, the operation of forming the micro-lens layer 328 is performed to form the micro-lens layer 328 including various micro-lenses 330, in which locations and areas of the micro-lenses 330 respectively correspond to those of the color filter portions 326a, 326b and 326c.

In the operation of forming the infrared filter layer 334, a refractive index of the infrared filter layer 334 may be designed based on a refractive index of an upper layer and a refractive index of a lower layer. For example, as shown in FIG. 4, a refractive index of the color filter layer 324 is equal to a square root of a product of the refractive index of the infrared filter layer 334 and a refractive index of the micro-lens layer 330.

Referring to FIG. 4 again, in various examples, before the operation of forming the infrared filter layer 334, an anti-reflective coating layer 322 is optionally formed on the surface 320 of the substrate 316 and to cover the photosensitive devices 318a, 318b and 318c. With formation of the anti-reflective coating layer 322, the amount of the radiation entering the photosensitive devices 318a, 318b and 318c is increased.

Figure 8:
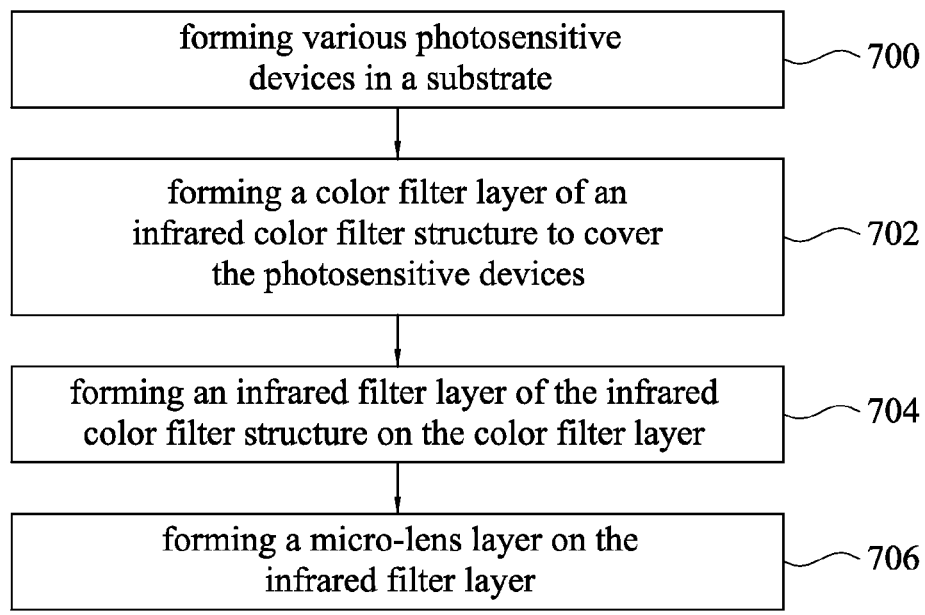
FIG. 8 is a flow chart of a method for manufacturing an image sensor in accordance with some embodiments.

Referring to FIG. 5 and FIG. 8, FIG. 8 is a flow chart of a method for manufacturing an image sensor in accordance with some embodiments. The method begins at operation 700, where various photosensitive devices 418a, 418b and 418c are formed in a substrate 416. The substrate 416 may be formed of a single-crystalline semiconductor material or a compound semiconductor material. For example, silicon, carbon, germanium, gallium, arsenic, nitrogen, indium, phosphorus, and/or the like, may be included in the substrate 416. In some examples, the photosensitive devices 418a, 418b and 418c may be respectively used to sense different visible radiations, such as red light, green light and blue light, and the photosensitive devices 418a, 418b and 418c may be arranged in an array. In certain examples, the photosensitive devices 418a, 418b and 418c are photodiodes.

Next, an infrared color filter structure 438 is formed over a surface 420 of the substrate 416. In some examples, as shown in FIG. 5, the infrared color filter structure 438 is formed to include a color filter layer 424 and an infrared filter layer 434. At operation 702, the color filter layer 424 of the infrared color filter structure 438 is formed to cover the photosensitive devices 418a, 418b and 418c using a coating process, for example. In some examples, the operation of forming the color filter layer 424 is performed to form the color filter layer 424 including various color filter portions 426a, various color filter portions 426b and various color filter portions 426c, in which locations of the color filter portions 426a, 426b and 426c respectively correspond to those of the photosensitive devices 418a, 418b and 418c.

At operation 704, the infrared filter layer 434 of the infrared color filter structure 438 is formed on the color filter layer 424 using, for example, a coating process, i.e. the infrared filter layer 434 is formed to be adjacent to the color filter layer 424. In some examples, the infrared filter layer 434 is formed to include an absorptive infrared filter structure for reducing the infrared reflection. The absorptive infrared filter structure may be formed from absorptive materials, such as phosphorus pentoxide and cupric oxide. In certain examples, the infrared filter layer 434 is formed to include a reflective infrared filter structure. For example, the reflective infrared filter structure may be formed to include a multi-film stacked structure, in which films of the multi-film stacked structure have different refractive indexes in an infrared region for reflecting the infrared.

At operation 706, a micro-lens layer 428 is formed above the infrared filter layer 434, i.e. the infrared filter layer 434 is formed to be further adjacent to the micro-lens layer 428 in addition to the color filter layer 424. In some example, the operation of forming the micro-lens layer 428 is performed to form the micro-lens layer 428 including various micro-lenses 430, in which locations and areas of the micro-lenses 430 respectively correspond to those of the color filter portions 426a, 426b and 426c.

In the operation of forming the infrared filter layer 434, a refractive index of the infrared filter layer 434 may be designed based on a refractive index of an upper layer and a refractive index of a lower layer. For example, as shown in FIG. 5, a refractive index of the infrared filter layer 434 is equal to a square root of a product of the refractive index of the color filter layer 424 and a refractive index of the micro-lens layer 430.

Referring to FIG. 5 again, in various examples, before the operation of forming the color filter layer 424, an anti-reflective coating layer 422 is optionally formed on the surface 420 of the substrate 416 and to cover the photosensitive devices 418a, 418b and 418c. With formation of the anti-reflective coating layer 422, the amount of the radiation entering the photosensitive devices 418a, 418b and 418c is increased.

In accordance with an embodiment, the present disclosure discloses an image sensor. The image sensor includes a substrate, photosensitive devices, a color filter layer, a micro-lens layer and an infrared filter layer. The photosensitive devices are disposed in the substrate. The color filter layer is disposed to cover the photosensitive devices. The micro-lens layer is disposed on the color filter layer. The infrared filter layer directly covers the micro-lens layer.

In accordance with another embodiment, the present disclosure discloses an image sensor. The image sensor includes a substrate, photosensitive devices, an infrared color filter structure and a micro-lens layer. The photosensitive devices are disposed in the substrate. The infrared color filter structure is disposed to cover the photosensitive devices. The micro-lens layer is disposed on the infrared color filter structure.

In accordance with yet another embodiment, the present disclosure discloses a method for manufacturing an image sensor. In this method, various photosensitive devices are formed in a substrate. A color filter layer is formed to cover the photosensitive devices. A micro-lens layer is formed above the color filter layer. An infrared filter layer is formed above the substrate and adjacent to the color filter layer and/or the micro-lens layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a substrate;
a plurality of photosensitive devices disposed in the substrate;
an infrared color filter structure disposed to cover the photosensitive devices, wherein the infrared color filter structure comprises an infrared filter layer disposed over the substrate and a color filter layer disposed on the infrared filter layer; and
a micro-lens layer disposed on the infrared color filter structure, wherein a refractive index of the color filter layer is equal to a square root of a product of a refractive index of the infrared filter layer and a refractive index of the micro-lens layer.

2. The image sensor of claim 1, further comprising an anti-reflective coating layer disposed between the substrate and the infrared color filter structure.

3. The image sensor of claim 1, wherein the infrared filter layer comprises a reflective infrared filter structure.

4. The image sensor of claim 3, wherein the reflective infrared filter structure is a multi-film stacked structure.

5. The image sensor of claim 4, wherein the multi-film stacked structure comprises a plurality of films, and the films of the multi-film stacked structure have different refractive indexes in an infrared region.

6. The image sensor of claim 1, wherein the substrate is formed from silicon, carbon, germanium, gallium, arsenic, nitrogen, indium or phosphorus.

7. A method for manufacturing an image sensor, the method comprising:
forming a plurality of photosensitive devices in a substrate;
forming a color filter layer to cover the photosensitive devices;
forming a micro-lens layer above the color filter layer; and
forming an infrared filter layer above the substrate and adjacent to the color filter layer and/or the micro-lens layer, wherein the color filter layer is formed to have a refractive index which is equal to a square root of a product of a refractive index of the infrared filter layer and a refractive index of the micro-lens layer.

8. The method of claim 7, wherein forming the infrared filter layer is performed to form the infrared filter layer under the color filter layer.

9. The method of claim 7, further comprising forming an anti-reflective coating layer on the substrate before forming the color filter layer to form the anti-reflective coating layer between the substrate and the color filter layer.

10. The method of claim 7, wherein the infrared filter layer is formed to comprise a reflective infrared filter structure.

11. The method of claim 10, wherein the reflective infrared filter structure is formed to be a multi-film stacked structure.

12. The method of claim 11, wherein the multi-film stacked structure is formed to comprise a plurality of films, and the films of the multi-film stacked structure have different refractive indexes in an infrared region.

13. The method of claim 7, wherein the color filter layer is formed by using a coating process.

* * * * *